(12) United States Patent
Watanabe

(10) Patent No.: US 11,106,255 B2
(45) Date of Patent: Aug. 31, 2021

(54) COOLING DEVICE

(71) Applicant: NEC Platforms, Ltd, Kawasaki (JP)

(72) Inventor: Mitsuhide Watanabe, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 107 days.

(21) Appl. No.: 15/294,962

(22) Filed: Oct. 17, 2016

(65) Prior Publication Data

US 2017/0185115 A1   Jun. 29, 2017

(30) Foreign Application Priority Data

Dec. 24, 2015 (JP) .............................. JP2015-251123

(51) Int. Cl.
*G06F 1/20* (2006.01)
*H01L 23/473* (2006.01)

(52) U.S. Cl.
CPC .......... *G06F 1/20* (2013.01); *G06F 2200/201* (2013.01); *H01L 23/473* (2013.01)

(58) Field of Classification Search
CPC .......... H05K 7/20145; H05K 7/20154; H05K 7/20272; F24F 1/0067; F24F 1/0063; F24F 1/00; F24F 1/0014; F24F 1/02; F24F 13/08; F24F 13/30; G06F 2200/201; G06F 1/20; H01L 23/473
See application file for complete search history.

(56) References Cited

U.S. PATENT DOCUMENTS

| | | | | |
|---|---|---|---|---|
| 3,200,609 A | * | 8/1965 | Laing | ...................... F04D 17/04 62/280 |
| 3,481,393 A | * | 12/1969 | Chu | .......................... F28F 3/12 165/104.31 |
| 5,954,127 A | * | 9/1999 | Chrysler | ................ F25B 39/024 165/164 |
| 6,601,643 B2 | * | 8/2003 | Cho | ....................... F28D 15/043 165/104.26 |
| 6,889,754 B2 | * | 5/2005 | Kroliczek | .............. F25B 23/006 165/104.11 |
| 6,970,355 B2 | * | 11/2005 | Ellsworth, Jr. | ........ H01L 23/467 165/122 |
| 7,000,684 B2 | * | 2/2006 | Kenny | ..................... F04B 17/00 165/104.21 |

(Continued)

FOREIGN PATENT DOCUMENTS

| | | | | |
|---|---|---|---|---|
| EP | | 0361196 A1 * | 4/1990 | ............... G06F 1/20 |
| JP | | H04-320399 A | 11/1992 | |

(Continued)

OTHER PUBLICATIONS

JP-2015049008-A mt (Year: 2015).*

(Continued)

*Primary Examiner* — Gordon A Jones
(74) *Attorney, Agent, or Firm* — Sughrue Mion, PLLC

(57) ABSTRACT

In order to enhance heat reception from a cooling target object by a heat sink to efficiently cool a device, the cooling target object, a cooling device including a heat sink and a fluid path is provided. Further, the heat sink includes a heat receiving face. The fluid path is formed so as to allow a predetermined fluid to pass therethrough. The heat exchange portion includes a first path arranged approximately in parallel to the heat receiving face of the heat sink.

10 Claims, 17 Drawing Sheets

(56) References Cited

U.S. PATENT DOCUMENTS

| | | | |
|---|---|---|---|
| 7,411,789 B2 | 8/2008 | Nishimura | |
| 7,944,694 B2* | 5/2011 | Campbell | H05K 7/20809 |
| | | | 165/104.33 |
| 8,240,365 B2* | 8/2012 | Obana | F28D 7/0041 |
| | | | 165/144 |
| 9,341,418 B2* | 5/2016 | Arvelo | F28F 1/00 |
| 2006/0002086 A1* | 1/2006 | Teneketges | H01L 23/473 |
| | | | 361/699 |
| 2006/0011326 A1* | 1/2006 | Yuval | F28D 1/0475 |
| | | | 165/80.4 |
| 2007/0000650 A1 | 1/2007 | Nishimura | |
| 2007/0217152 A1* | 9/2007 | Kloeppel | G06F 1/20 |
| | | | 361/698 |
| 2010/0103618 A1* | 4/2010 | Campbell | H05K 7/20236 |
| | | | 361/699 |
| 2011/0100604 A1 | 5/2011 | Anzai | |
| 2011/0228470 A1* | 9/2011 | Chang | G06F 1/20 |
| | | | 361/679.47 |
| 2012/0055655 A1* | 3/2012 | Aoki | G06F 1/203 |
| | | | 165/121 |
| 2012/0279251 A1* | 11/2012 | Kido | F25B 31/006 |
| | | | 62/498 |
| 2013/0100610 A1* | 4/2013 | Schneider | H05K 7/20145 |
| | | | 361/690 |
| 2013/0126144 A1* | 5/2013 | Sheu | F28F 1/00 |
| | | | 165/181 |
| 2013/0206374 A1* | 8/2013 | Roisin | B22F 7/002 |
| | | | 165/165 |
| 2014/0251585 A1* | 9/2014 | Kusuda | F28D 1/06 |
| | | | 165/164 |
| 2015/0059388 A1* | 3/2015 | Hirano | H05K 7/20772 |
| | | | 62/259.2 |
| 2016/0223265 A1* | 8/2016 | Jindou | F24F 1/18 |

FOREIGN PATENT DOCUMENTS

| | | |
|---|---|---|
| JP | H05-183281 A | 7/1993 |
| JP | 2000-332176 A | 11/2000 |
| JP | 2002-353656 A | 12/2002 |
| JP | 2007-013052 A | 1/2007 |
| JP | 2008-507129 A | 3/2008 |
| JP | 2011-094888 A | 5/2011 |
| JP | 2015049008 A * | 3/2015 |

OTHER PUBLICATIONS

EP 0361196 A1 mt (Year: 1990).*
Japanese Office Action for JP Application No. 2015-251123 dated Apr. 3, 2018 with English Translation.
Japanese Office Action for JP Application No. 2015-251123 dated Oct. 2, 2018 with English Translation.

* cited by examiner

COOLING DEVICE

This application is based upon and claims the benefit of priority from Japanese Patent Application No. 2015-251123, filed on Dec. 24, 2015, the disclosure of which is incorporated herein in its entirety by reference.

TECHNICAL FIELD

The present invention relates to cooling devices. In particular, the present invention relates to a cooling device for cooling a device mounted in an information processing apparatus, such as a computer or a server.

BACKGROUND ART

In an electronics device, such as an information processing apparatus, devices that generate heat, such as a central processing unit (CPU), are mounted. In order to cool such devices, a cooling device, such as a heat sink, is used.

FIG. 17 illustrates an exemplary configuration of a general information processing apparatus 100. The information processing apparatus 100 is provided therein with a printed substrate 13, and on this printed substrate 13, a device that generates a large amount of heat, such as a CPU, and other devices 135 are mixed with one another and are mounted on the printed substrate 13. The device, which generates a large amount of heat, will be referred to as a cooling target object 131 hereinafter. In the general information processing apparatus 100, heat having been generated in the cooling target object 131 is conducted to a heat sink 110 via a heat spreader 132, and wind sent from a fan 136 disperses the heat, having been conducted to the heat sink 110, to the inside and the outside of the information processing apparatus 100.

The heat, having been discharged to the inside of the information processing apparatus 100, causes a rise of internal temperature of the information processing apparatus 100. Particularly, a rise of ambient temperature of a device 135 among the devices 135 that is mounted at the downwind side of the cooling target object 131 may deteriorate the component performance of the device 135. A continuous use of the devices 135 under such a high temperature condition may accelerate the increase of failure rates of the devices 135, that is, may reduce the lifetimes of the devices 135. For this reason, sufficient cooling inside the apparatus is needed up to a degree that satisfies temperature conditions that guarantee the proper operations of the devices 135, which are not cooled in such a cooling method as implemented on the cooling target object 131.

In Japanese Unexamined Patent Application Publication No. 2007-013052 (hereinafter referred to as a patent document 1), a forced-air cooling heat sink is disclosed. This heat sink has a structure in which heat radiation fins are arrayed in its inside and which allows cooling air from a high static-pressure supply fan to be supplied to the inside. The heat sink disclosed in the patent document 1 is installed so as to be in contact with a cooling target object inside a device such as a small-size projector.

In Japanese Unexamined Patent Application Publication No. 2008-507129 (hereinafter referred to as a patent document 2), a heat exchange system is disclosed. This heat exchange system includes a cooling device suitable for removing heat generated from a mainframe or a server. In the heat exchange system disclosed in the patent document 2 in an environment like a blade server, that is, in an environment constituted by a plurality of modulized information processing apparatuses (hereinafter referred to as blades), the heat exchange device is installed for each of CPUs mounted in the respective blades. A U-shaped pipe that allows a refrigeration medium to flow inside the U-shaped pipe itself is disposed inside the heat exchange device. The U-shaped pipe is disposed such that the vertex portion of the U-shaped pipe is located near a heat-transfer contact face; the refrigeration medium is sent into the U-shaped pipe in a direction reverse to a direction of a heat flux; and the refrigeration medium, having passed through the vertex portion, is discharged in the direction of the heat flux.

With respect to the heat sink disclosed in the patent document 1, unfortunately, the cooling efficiency of the heat sink varies in accordance with the variation of the temperature of the cooling target object. This is because, in the heat sink disclosed in the patent document 1, with the variation of the flow speed of the flown-through air, the direction of the flow of the air varies because the shape and the disposition of the fins inside the heat sink are fixed, and this variation of the direction of the air flow causes the variation of the temperature distribution inside the heat sink.

With respect to the heat exchange device disclosed in the patent document 2, unfortunately, there is room for improvement in the heat exchange efficiency. This is because, in the heat exchange device disclosed in the patent document 2, the refrigeration medium, having been sent into the U-shaped pipe, is caused to be turned at the vertex portion of the U-shape, and this configuration leads to a period of time not enough for the refrigeration medium to stay at a portion where temperature is higher than any other portion inside the heat exchange device.

SUMMARY

It is an object of the present invention to provide a cooling device that has been enhanced in heat reception from a cooling target object by a heat sink and that enables efficient cooling of a device, the cooling target object.

A cooling device according to one aspect of the present invention includes a heat sink and a fluid path. The heat sink includes a heat receiving face. The fluid path is formed so as to allow a predetermined fluid to pass therethrough. The heat exchange portion includes a first path arranged approximately in parallel to the heat receiving face of the heat sink.

BRIEF DESCRIPTION OF THE DRAWINGS

Exemplary features and advantages of the present invention will become apparent from the following detailed description when taken with the accompanying drawings in which.

EXAMPLE EMBODIMENT

Hereinafter, example embodiments in which the present invention is embodied will be described with reference to the drawings. It is to be noted that, although example embodiments described below involve limitations technically preferable to practice the present invention, the scope of the present invention is not limited to the example embodiments described below. In all figures for use in description of example embodiments described below, similar constituent elements are denoted by the same reference sign unless there is a specific reason. In example embodiments described below, duplicated description of similar configurations and operations may be omitted.

First Example Embodiment

First, a cooling device according to a first example embodiment of the present invention will be described with reference to some of the drawings. Although, in the following, description will be made by way of specific examples of structures and configurations, the structure and configuration of the cooling device according to this example embodiment are not limited to specific examples described below. Further, in the following figures, coordinate axes (constituting an xyz coordinate system) are illustrated to make it easy to grasp the direction of each of constituent elements.

Figure 1:
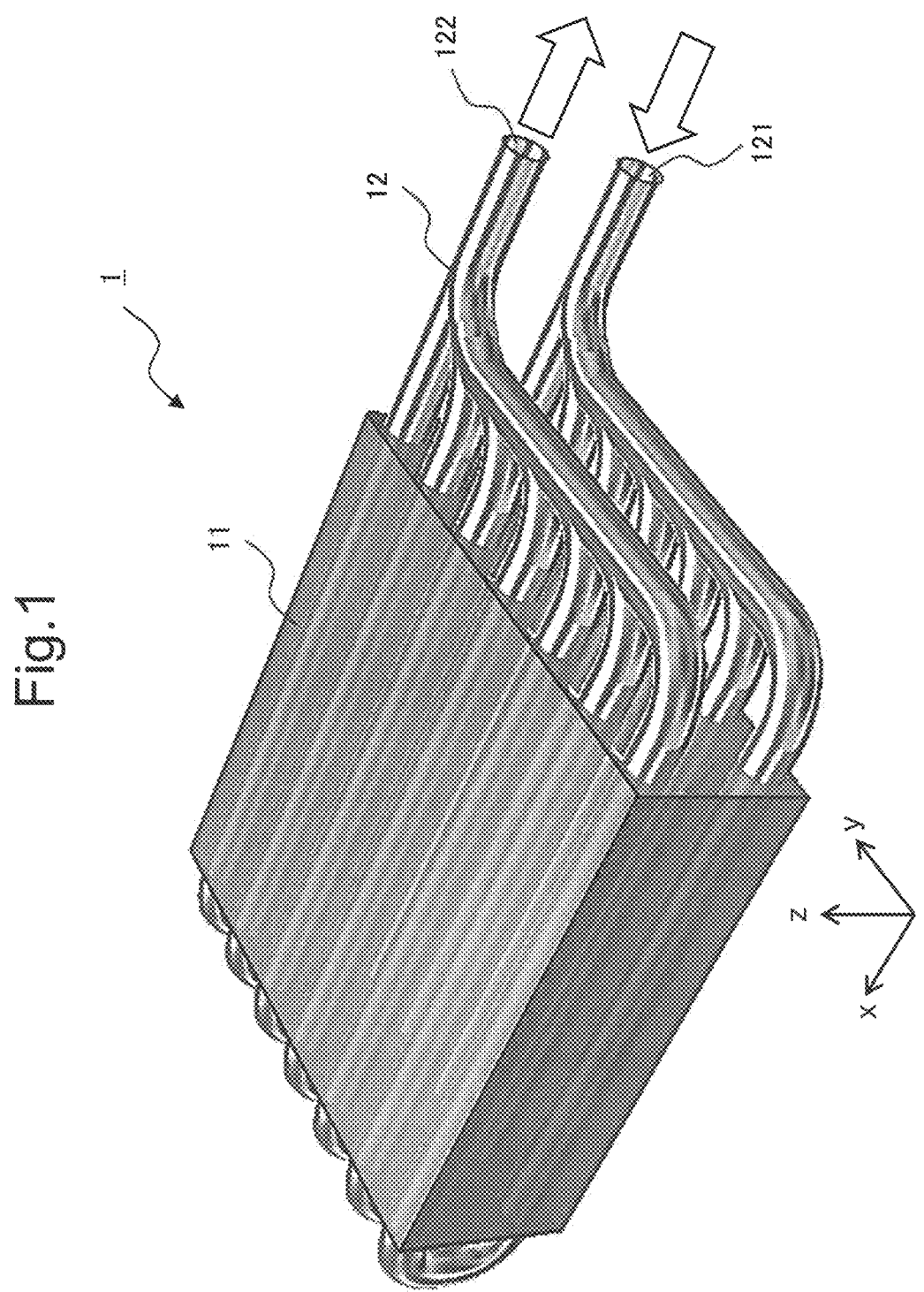
FIG. 1 is a perspective view of an example of a cooling device according to a first example embodiment of the present invention.
Figure 2:
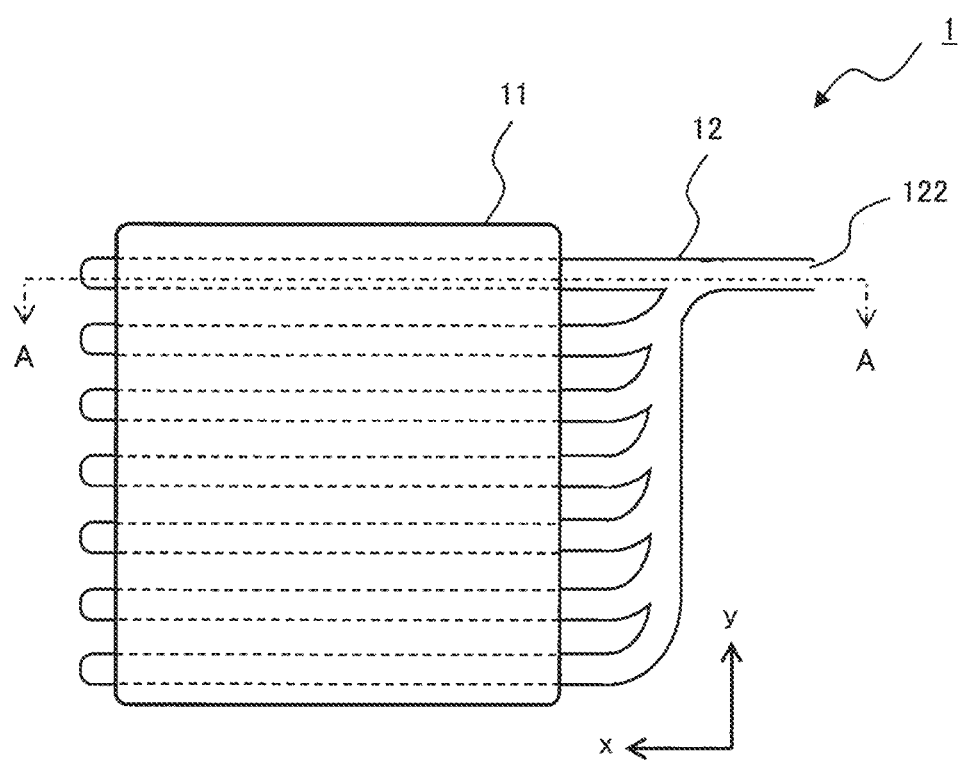
FIG. 2 is a plan view of an example of a cooling device according to a first example embodiment of the present invention.
Figure 3:
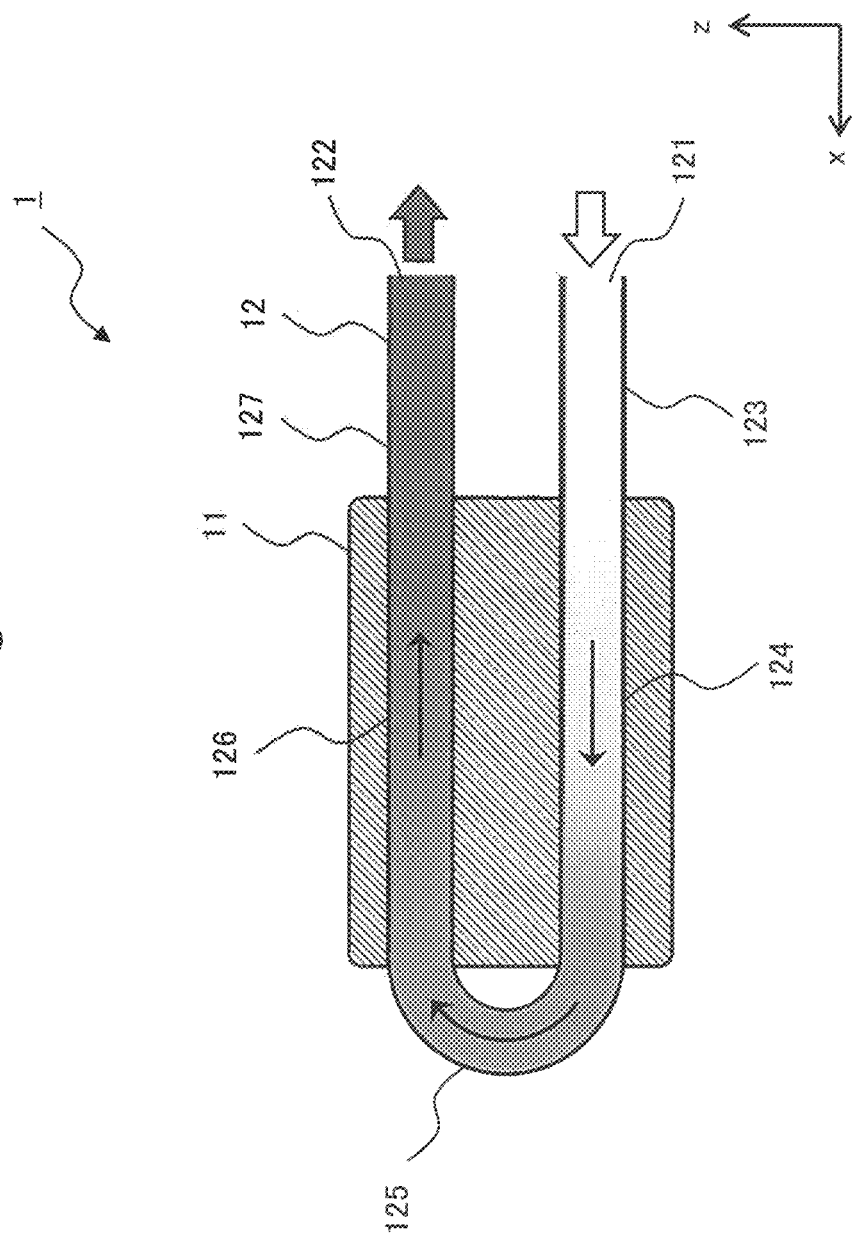
FIG. 3 is a cross-sectional view of an example of a cooling device according to a first example embodiment of the present invention.

FIG. 1 is perspective view of a cooling device 1, an example of the cooling device according to this example embodiment. FIG. 2 is a plan view of the cooling device 1. FIG. 3 is a cross-sectional view of the cooling device 1 taken by the line A-A of FIG. 2.

As shown in FIG. 1, the cooling device 1 includes a heat sink 11 and a fluid path 12. The heat sink 11 and the fluid path 12 are combined with each other so as to be thermally coupled to at least one portion of each other and be able to make a mutual heat exchange. The heat sink 11 and the fluid path 12 are not necessarily in physically contact with each other, provided that the heat sink 11 and the fluid path 12 are disposed so as to allow a mutual heat exchange to be made therebetween.

The cooling device 1, shown in FIG. 1, has a structure in which the fluid path 12 is disposed inside the heat sink 11. It is supposed, here, that a device, a cooling target object, is disposed at the lower side, that is, a heat receiving face side, of the heat sink 11.

The fluid path 12 of the cooling device 1, shown in FIG. 1, is structured to be branched into a plurality of branched paths at one end face side of the heat sink 11, and to allow the plurality of branched paths to penetrate from the one end face side to the other end face side of the heat sink 11. The branched paths having penetrated the other end face of the heat sink 11 are caused to be turned in a U-shape at the other end face side. The branched paths having been returned penetrate from the other end face side to the one end face side, and then penetrate the one end face. Further, the branched paths having penetrated the one end face are united into one path at the one end face side. FIG. 2 illustrates a state in which the branched paths, resulting from the branching of the fluid path 12, penetrate the one end face, and then are united into one path. Any structure that allows both of an air supply path and an air discharge path to be secured may be employed as the structure of the fluid path 12.

In the cooling device 1, shown in FIG. 1, fluid having been supplied to the fluid path 12 absorbs heat of the heat sink 11 while passing through the branched paths inside the heat sink 11, and then is discharged. As shown in FIG. 3, fluid is injected into the inside of the fluid path 12 to cool the heat sink 11. The injected fluid passes through the lower side of the inside of the heat sink 11, and then is turned. The fluid having been turned passes through the upper side of the inside of the heat sink 11, and then is discharged.

In the inside of the fluid path 12, predetermined fluid for cooling the heat sink 11 is allowed to flow. In the inside of the fluid path 12, air is preferable to be allowed to flow as the predetermined fluid. Further, in the inside of the fluid path 12, any kind of gas among nitrogen, argon, carbon dioxide, and any other appropriate kind of gas may be allowed to flow as the predetermined fluid. Further, in the inside of the fluid path 12, any kind of liquid among water, alcohol, and any other appropriate kind of liquid may be allowed to flow as the predetermined fluid. That is, any kind of fluid capable of absorbing the heat of the heat sink 11 and passing through the inside of the fluid path 12 may be selected as the predetermined fluid. In this regard, however, the predetermined fluid is required not to block the inside of the fluid path 12, and further is required to be safety even upon leakage.

The heat sink 11 is a block having high heat conductivity. The heat sink 11 is thermally coupled to a device that generates heat (hereinafter referred to as a cooling target object), such as a central processing unit (CPU). The heat sink 11 is a member for absorbing heat generated in a cooling target object from a heat receiving face via a heat spreader and discharging the absorbed heat toward a position far from the cooling target object. A block material forming a homogeneous aggregate or a block material having a cavity inside thereof may be used as the material of the heat sink 11. Further, in order to create a larger surface area of the heat sink 11 to facilitate radiation from the surface of the heat sink 11, an uneven pattern or fins may be formed on the surface of the heat sink 11. Alternatively, the surface of the heat sink 11 may be formed so as to be smooth.

For the material of the heat sink 11, it is preferable to employ a high thermal-conductivity material, such as a metallic material. For example, a high thermal-conductivity metallic material containing copper, aluminum, iron, or any other high thermal-conductivity metal is suitable for the heat sink 11. Moreover, examples of the material of the heat sink 11 include a high thermal-conductivity ceramic material, such as an aluminum-nitride material or a silicon-nitride material; an alloy, such as a copper molybdenum alloy; a complex, such as an aluminum-carbon silicon complex. Examples of the material of the heat sink 11 are, however, not limited to the materials described above, and any other appropriate material may be selected. The surface of the heat sink 11 may be clad by a heat insulation material to facilitate conduction of heat to the fluid path 12.

The fluid path 12 is a path for allowing air having been flown into the inside to absorb the heat of the heat sink 11, and discharging the absorbed heat to the outside of this system. The fluid path 12 has a pipe-shaped structure resulting from forming a material made of metal, plastic, ceramic, glass, or any other appropriate material into the pipe shape. The material of the fluid path 12 may be appropriately selected in accordance with the heat generation amount of the cooling target object 131 and the atmosphere of the installation place.

The fluid path 12 has a structure formed so as to enable the predetermined fluid to be conducted therein. Although it is preferable that a cavity is formed in the inside of the fluid path 12, any object may be disposed in the inside of the fluid path 12, provided that the object does not block the conduction of the fluid. For example, an absorbing agent for absorbing impurities contained in the predetermined fluid, a straightening mechanism for straightening the flow of the predetermined fluid and/or high thermal-conductivity particles for facilitating conduction of heat to the predetermined fluid may be disposed in the inside of the fluid path 12. Further, the cross-sectional area of the cross section of the fluid path 12 is not necessarily constant, and the cross-sectional shape of the fluid path 12 may form any shape. For example, an uneven pattern may be formed in the inside of the fluid path 12 to increase the thermal conduction between the fluid path 12 and the predetermined fluid.

The fluid path 12 includes a heat exchange portion thermally coupled to the heat sink 11. The heat exchange portion includes a first path disposed approximately in parallel to the heat receiving face of the heat sink 11, and a second path into which air having passed through the first path is sent. The heat exchange portion has a structure that allows its path to reciprocate at least one time at a portion inside or outside the heat sink 11 to increase the area of a thermally coupling portion to be coupled to the heat sink 11 so as to facilitate the heat exchange between the heat sink 11 and the heat exchange portion. In other words, the cooling device 1, shown in FIG. 1, has a structure in which each of the first path and the second path is branched into a plurality of branched paths.

The fluid path 12 communicates with an opening of an intake port 121 and an opening of a discharge port 122. The intake port 121 is disposed in one end portion of the fluid path 12, and the discharge port 122 is disposed in the other end portion of the fluid path 12. The intake port 121 takes air into the inside of the fluid path 12, and the discharge port 122 discharges air from the inside of the fluid path 12. That is, the fluid path 12 includes the intake port 121 extending from the first path, and the discharge port 122 extending from the second path.

Since, in this example embodiment, it is intended to describe the structure of the cooling device 1, a mechanism for sending air into the inside of the fluid path 12 is not illustrated. Actually, the mechanism for sending air into the inside of the fluid path 12 is coupled to any one of the end portions of the liquid path 12 at minimum. A device for sending air into the inside of the fluid path 12 will be described later.

As shown in FIG. 3, the fluid path 12 includes an air supply path 123, a first path 124, a turning path 125, a second path 126, and an air discharge path 127. The first path 124, the turning path 125, and the second path 126 constitute the heat exchange portion. As shown in FIG. 3, a structure that allows the fluid path 12 to be turned in the turning path 125 makes the fluid path 12 compact. Although, in the example shown in FIG. 3, the turning path 125 is disposed at the outside of the heat sink 11, the turning path 125 may be disposed inside the heat sink 11.

Cooling air injected from the intake port 121 is sent from the air supply path 123 to the first path 124, and absorbs heat from the heat sink 11 while passing through the first path 124. Air having been warmed while passing through the first path 124 is turned while passing through the turning path 125, and then is sent to the second path 126. Air passing through the second path 126 further absorbs heat from the heat sink 11 or discharges heat to the heat sink 11, depending on the magnitude relation between the temperature of the heat sink 11 and the temperature of the air passing through the second path 126. The air having passed through the second path 126 is sent to the air discharge path 127, and then is discharged from the discharge port 122. In this way, air having been injected from the intake port 121 into the inside of the fluid path 12 is warmed through the absorption of the heat from the heat sink 11 in the heat exchange portion, and then is discharged from the discharge port 122.

As shown in FIG. 3, in the fluid path 12 of the cooling device 1, the first path 124 is disposed nearer the heat receiving face than the second path 126, and the first path 124 and the second path 126 are disposed side by side with each other. In the structure of the cooling device 1 shown in FIG. 3, the direction in which air having been supplied to absorb the heat from the heat sink 11 proceeds is reverse to the direction air having been warmed through the absorption of the heat from the heat sink 11 proceeds. With respect to the heat sink 11 itself, the temperature of the lower side thereof near the cooling target object (i.e., at the heat receiving face side) is high, and the temperature of the upper side thereof far from the cooling target object is low. That is, the disposition of the fluid path 12, shown in FIG. 3, allows cool air to be sent to the lower side of the heat sink 11, at which the temperature is relative high, and allows warmed air to be sent to the upper side of the heat sink 11, at which the temperature is relatively low. As a result, at the heat receiving face side of the heat sink 11, a thermal gradient from the cooling target object to the heat sink 11 becomes large up to a degree that allows a heat movement to be likely to be made, and this increases the cooling effect.

In this way, the configuration of the cooling device 1, according to this example embodiment, enhances heat reception from a cooling target object by the heat sink 11, and realizes efficient cooling of a device, the cooling target object.

Here, a cooling device 1-2, another example of the cooling device 1, according to this example embodiment, will be described.

Figure 4:
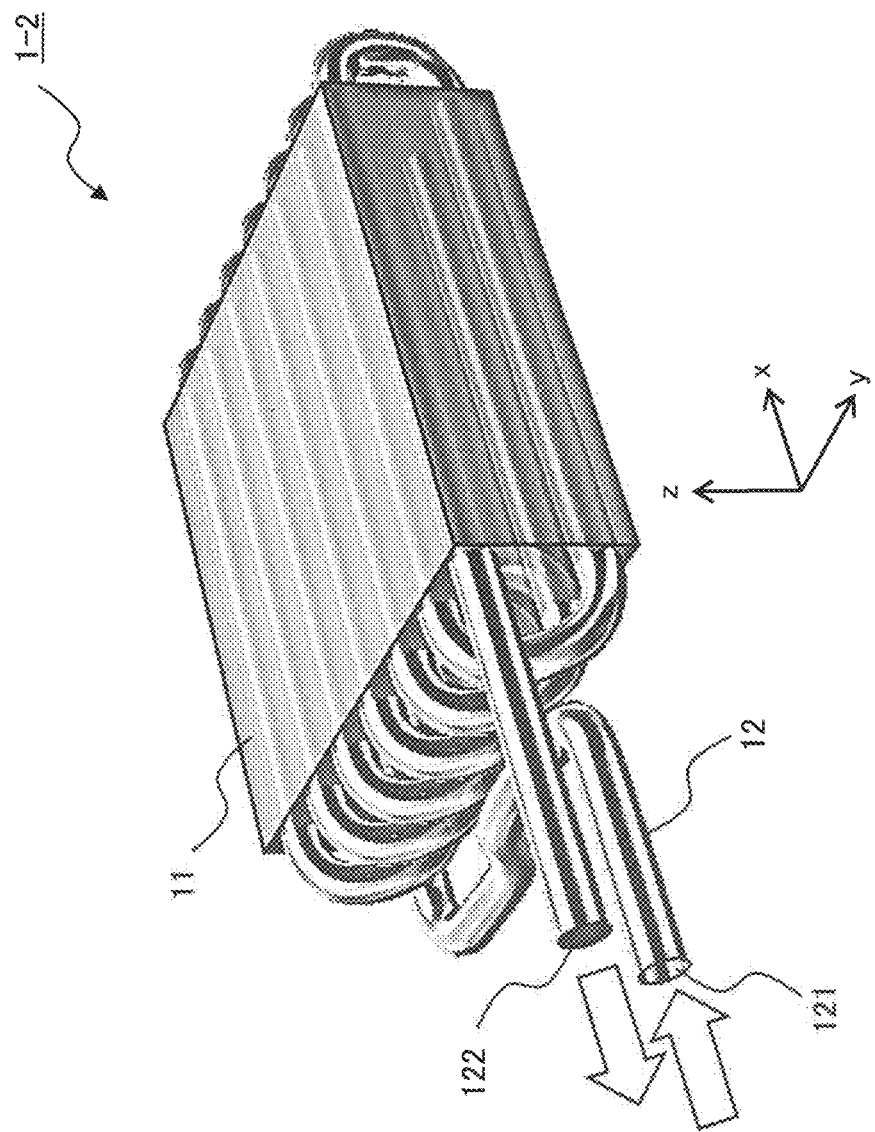
FIG. 4 is a perspective view of another example of a cooling device according to a first example embodiment of the present invention.

The cooling device 1-2, shown in FIG. 4, is different from the cooling device 1, shown in FIG. 1, in the turning structure of the fluid path 12. The cooling device 1-2 has a turning structure that allows one single pipe-shaped fluid path 12 to reciprocate between one end face and the other end face at a plurality of times. That is, the cooling device 1-2 has a structure in which pairs of a first path 124 and a second path 126 are coupled in series via turning paths 125. In other words, a heat exchange portion of the cooling device 1-2, shown in FIG. 4, has a structure in which a plurality of pairs of the first path 124 and the second path 126 are coupled to one another so as to allow air having passed through the second path 126 of an upstream-side pair of the plurality of pairs is sent to the first path 124 of a downstream-side pair of the plurality of pairs. Two successive pairs among the plurality of pairs are coupled to each other so as to allow air having passed through the second path 126 of an upstream-side pair of the two successive pairs is sent to the first path 124 of a downstream-side pair of the two successive pairs.

A fluid path 12 of the cooling device 1-2 is inserted into the inside from one end face of the heat sink 11. The fluid path 12 is turned after having penetrated the other end face, and then is returned to the inside again from the other end face. Afterward, the fluid path 12 penetrates the inside of heat sink 11 from the other end face to the one end face. Further, the fluid path 12 is turned at the one end side, and then penetrates the inside of the heat sink 11. The fluid path 12 reciprocates in the inside of the heat sink 11 several times, and then extends from the one end face of the heat sink 11 toward the outside.

Figure 17:
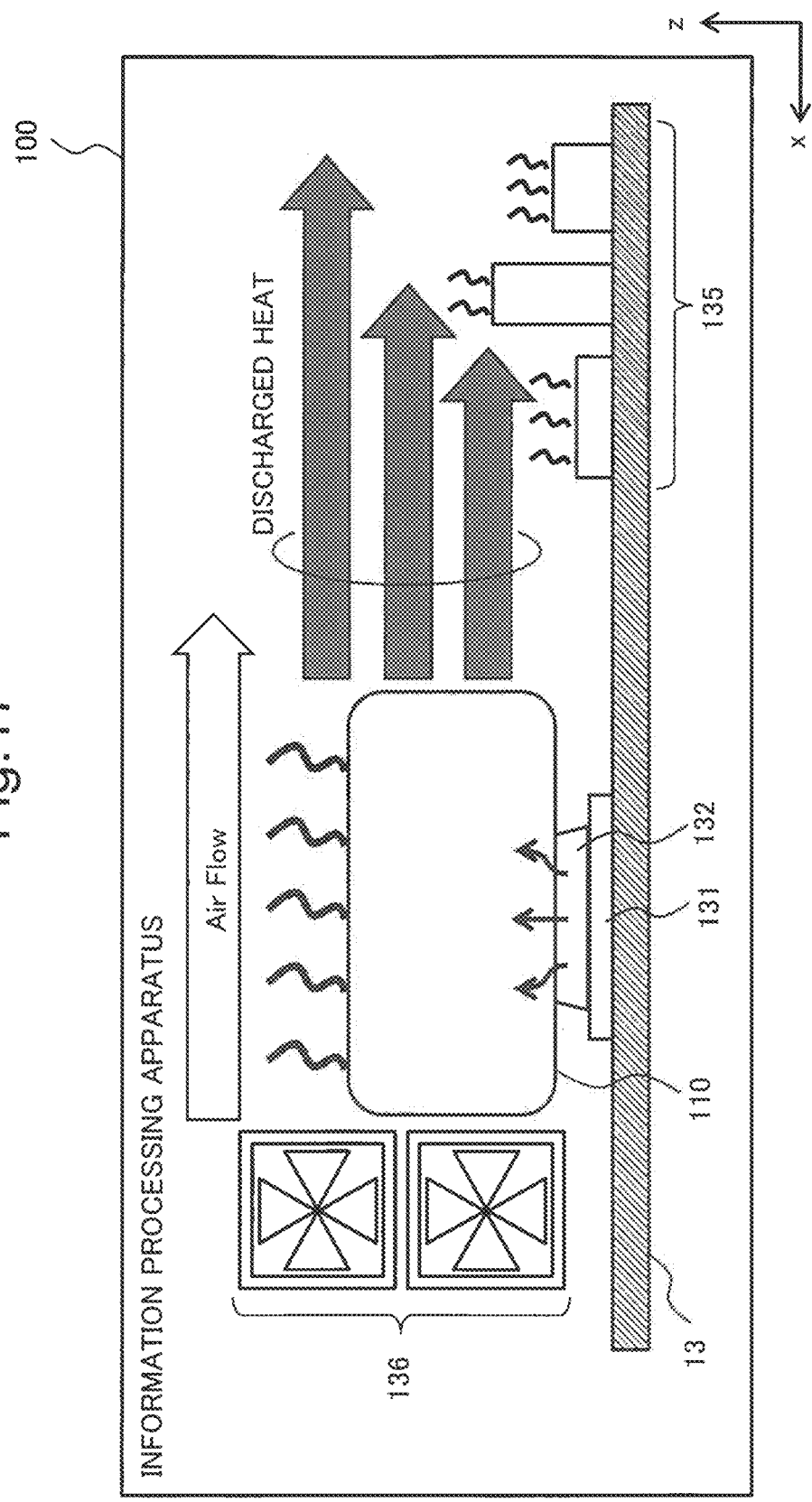
FIG. 17 is a conceptual diagram illustrating a heat movement inside an information processing apparatus mounting a general cooling device.

In the structure of the cooling device 1-2, shown in FIG. 4, air having been warmed by a cooling target object is sent to a portion near the cooling target object again. Thus, as compared with the cooling device 1, shown in FIG. 1, the cooling efficiency of the cooling device 1-2 is lower. Even when, however, air having been warmed once by heat from the cooling target object is warmed again by the heat from the cooling target object, the temperature of the air does not become higher than or equal to the temperature of the cooling target object, and thus, as compared with the case shown in FIG. 17, in which the fluid path 12 does not exist, a higher cooling efficiency is obtained.

Each of the cooling devices 1 and 1-2, according to this example embodiment and having been described using examples shown in FIGS. 1 to 4, includes the heat sink 11 and the fluid path 12 at minimum. The fluid path 12 includes the heat exchange portion, which is thermally coupled to the heat sink 11. Fluid, such as air, is allowed to flow in the inside of the fluid path 12.

The heat exchange portion of the fluid path 12 includes the first path 124, which is disposed approximately in parallel to the heat receiving face of the heat sink 11. Since the first path 124 is disposed approximately in parallel to the heat receiving face of the heat sink 11, a period of time during which the distance from the first path 124 to the heat receiving face is constant becomes long. For this reason, in the heat exchange portion, including the first path 124, the heat from the heat sink 11 is efficiently absorbed in a portion where the first path 124 is disposed.

Without limited to such turning structures shown in FIGS. 1 to 4, any structure including, at minimum, one or more portions that are disposed approximately in parallel to the heat receiving face of the heat sink 11 may be employed. For example, the heat exchange portion may be configured to straightly penetrate from one end portion of the heat sink 11 toward the other end portion opposite the one end portion. Further, for example, the heat exchange portion may be formed in a spiral shape, such as a shape in which the heat exchange portion is coiled from the lower side to the upper side of the heat sink 11. The heat exchange portion may be configured to proceed in parallel to the heat receiving face from one end face to the other end face, and to include a portion which is located adjacent to the other end face and at which the heat exchange portion itself is caused to approximately vertically turn. For example, the heat exchange portion may include a portion inclined obliquely upwardly or obliquely downwardly relative to the heat receiving face. In such configurations described above, however, in order to provide a large number of thermally coupling portions between the heat sink 11 and the fluid path 12, and compactly dispose the fluid path 12, such a turning structure as illustrated in FIGS. 1 to 4 is preferable to be implemented.

Subsequently, examples of the configuration of a cooling system according to this example embodiment, that is, a cooling system that is implemented in an information processing apparatus 10 and that is constituted of the cooling device according to this example embodiment will be described.

Figure 5:
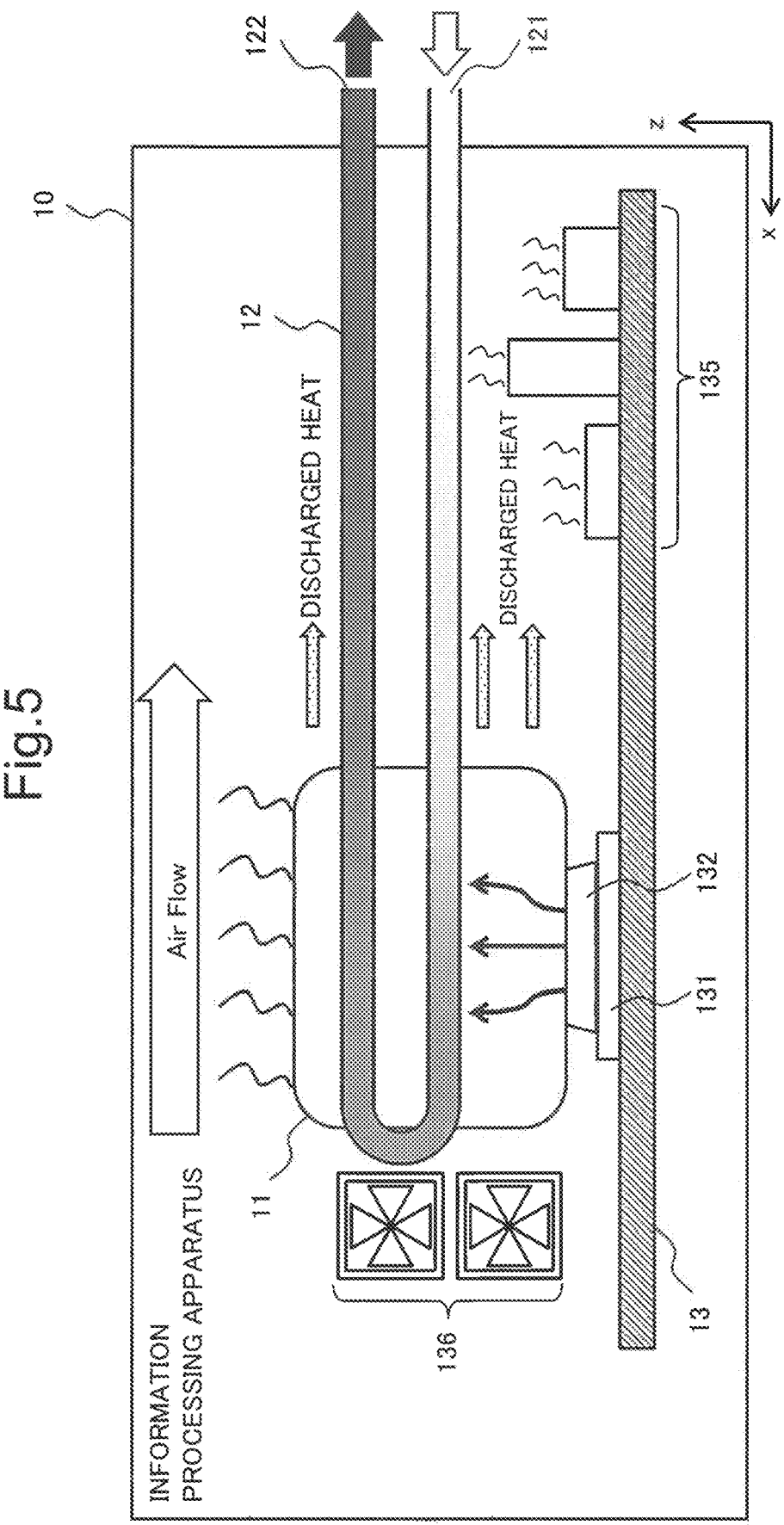
FIG. 5 is a conceptual diagram illustrating a heat movement inside an information processing apparatus mounting a cooling device according to a first example embodiment of the present invention.
Figure 6:
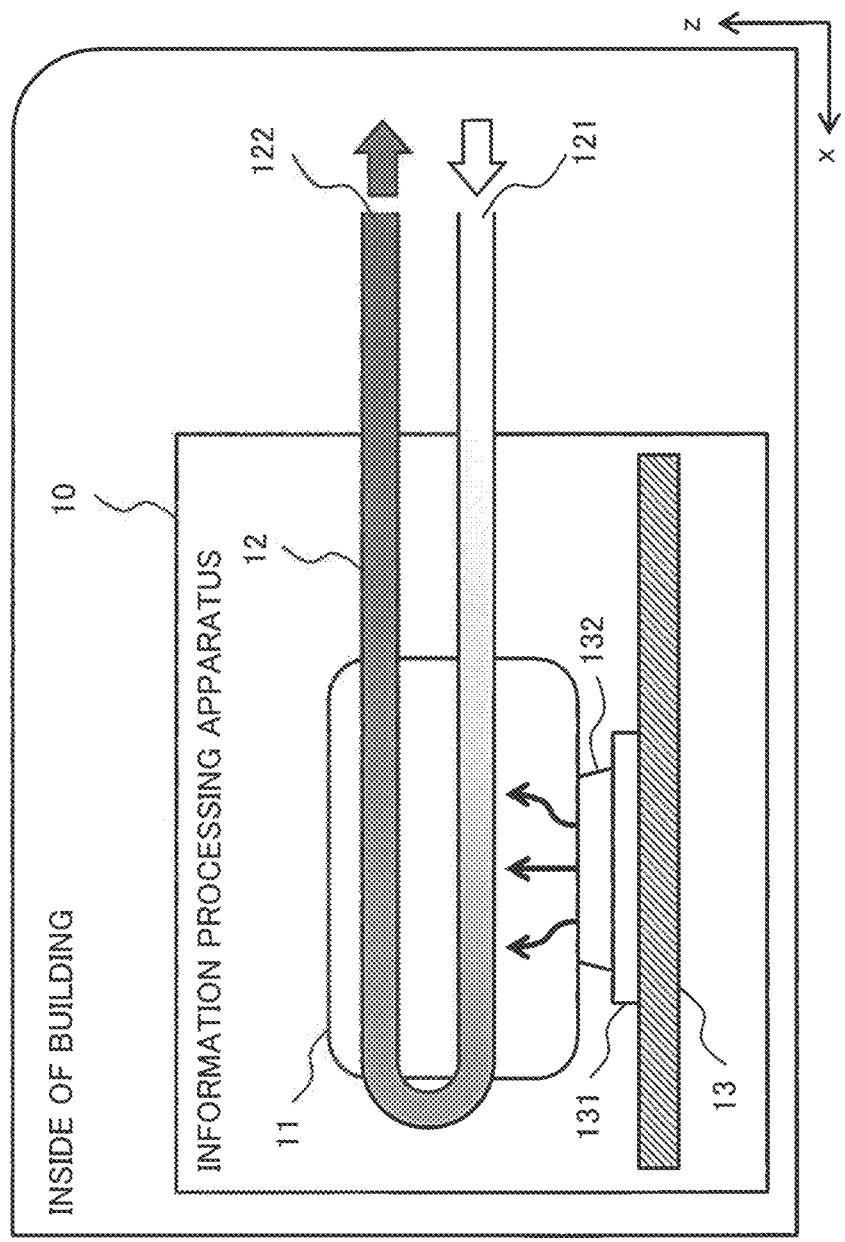
FIG. 6 is a conceptual diagram illustrating an exemplary configuration of an information processing apparatus mounting a cooling device according to a first example embodiment of the present invention.

FIGS. 5 and 6 illustrate examples of the configuration of a cooling system according to this example embodiment, that is, a cooling system implemented in the information processing apparatus 10.

FIG. 5 illustrates an example of the configuration of a cooling system in which the heat sink 11 and the fluid path 12 are mounted on a device that generates heat (hereinafter also referred to as a cooling target object 131), and that is mounted on the printed substrate 13, which is disposed inside the information processing apparatus 10. It is supposed that at least one cooling target object 131 is mounted on the printed substrate 13. The heat sink 11 according to this example embodiment is thermally coupled to the cooling target object 131 via the heat spreader 132. A fan 136 is installed inside the information processing apparatus 10, and this fan 136 sends wind toward the heat sink 11. The devices 135, devices other than the cooling target object 131, are mounted on the printed substrate 13. The devices 135 are located at the downwind side of the cooling target object 131.

As shown in the example illustrated in FIG. 5, the intake port 121 and the discharge port 122 are disposed at the outside of the information processing apparatus 10, in which the cooling target object 131 is mounted. For example, as shown in the example illustrated in FIG. 6, the intake port 121 and the discharge port 122 may be disposed at the inside of a building in which the information processing apparatus 10 is installed. In a cooling system according to this example embodiment, in order to cool the cooling target object 131, air for use in cooling is supplied from the intake port 121; heat having been conducted to the heat sink 11 is absorbed by air of the heat exchange portion of the fluid path 12; and air having been warmed is discharged from the discharge port 122.

In the example illustrated in FIG. 5 with respect to the cooling system according to this example embodiment, the intake port 121 and the discharge port 122 are disposed at the inside of the building, in which the information processing apparatus 10 is installed. When a small number of devices including the information processing apparatus 10 and any other device are installed at the inside of the building, such a configuration as shown in the example illustrated in FIG. 6 may be employed, provided that the temperature of the inside of the building does not excessively rise. When, however, a large number of devices including the information processing apparatus 10 and any other device are installed at the inside of the building, the temperature of the inside of the building is likely to rise, and thus, the intake port 121 and the discharge port 122 are preferable to be disposed at the outside of the building.

As described above, the cooling system according to this example embodiment has a characteristic that both of the intake port and the discharge port are disposed at the outside of the information processing apparatus. That is, in the cooling system according to this example embodiment, both of the air supply path, for use in supplying air for cooling the heat sink, and the air discharge path, for use in discharging heat from the heat sink to the outside, are secured. According to the cooling system according to this example embodiment, a path for discharging heat having been generated from each of cooling target objects is secured, and this configuration enables heat discharged from the information processing apparatus to move to the outside of the path without dispersing the heat, discharged from the information processing apparatus.

According to the cooling system according to this example embodiment, when a fan cools a heat sink secured to a device that generates heat and is mounted inside the information processing apparatus, heat having been generated from the device is discharged into the fluid path without allowing part of the heat to be applied to electronics components and any other similar component existing at the downwind side of the heat sink. Thus, the reduction of the cooling capacity inside the information processing apparatus is made possible.

In general, when electronics components and any other similar component are continuously used under a high temperature condition having been influenced by heat discharged from a heat sink, the heat may increase the failure rates of the electronics components and any other similar component and, as a result, may reduce the lifetimes thereof. In contrast thereto, according to the cooling system according to this example embodiment, the heat discharge path is secured so as not to exert the influence of the discharged heat on the electronics components and any other similar component existing at the downwind side of the heat sink, and thus, this configuration does not cause the increase the failure rates of the electronics components and any other similar component, and the reduction of the lifetimes thereof. That is, the cooling system according to this example embodiment does not exert the influence of the discharged heat on the downwind side of the heat sink, and thus, this configuration eases restrictions on the installation and disposition of electronics components and any other similar component that are placeable at the downwind side of the heat sink.

The cooling system according to this example embodiment realizes the reduction of the capacity of the information processing apparatus, and this reduction of the cooling capacity leads to the reduction of the power consumption of the whole of the information processing apparatus. Moreover, the cooling system according to this example embodiment decreases the rotation number of a fan for use in the cooling, and this reduction of the rotation number of the fan leads to the reduction of undesired noise due to the rotation of the fan.

In the cooling system according to this example embodiment, the cooling target object is cooled using air without employing any cooling/heat discharging method using a particular refrigeration medium. Thus, even if the air, a refrigeration medium, is leaked to the outside of the fluid path, this leakage does not cause any chemical deterioration or any other undesired influence on other electronics components and any other similar component mounted inside the information processing apparatus.

Modification Examples

Here, modification examples of the cooling device 1 according to this example embodiment will be described with reference to some of the drawings.

Figure 7:
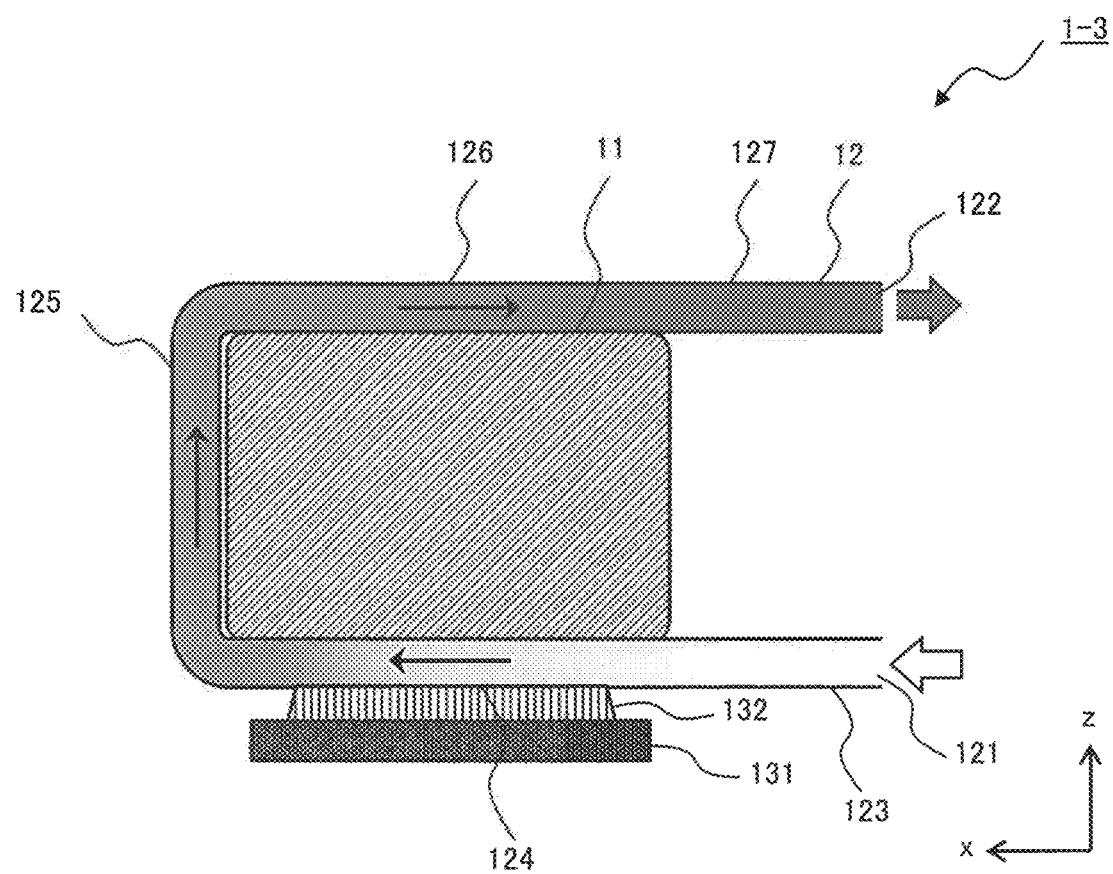
FIG. 7 is a conceptual diagram illustrating modification example 1 of a cooling device according to a first example embodiment of the present invention.

FIG. 7 is a cross-sectional view of a cooling device 1-3 in modification example 1. In the cooling device 1-3, the fluid path 12 is disposed so as to surround the outside of the heat sink 11. The fluid path 12 is in contact with the heat spreader 132 at the lower side of the heat sink 11. The heat sink 11 is thermally coupled to the cooling target object 131 and the heat spreader 132 via the fluid path 12.

In the cooling device 1-3, a heat exchange portion including the first path 124, the return path 125 and the second path 126 is disposed at the outside of the heat sink 11. The first path 124 is in contact with the heat spreader 132 to allow heat discharged from the cooling target object 131 to be absorbed directly from the heat spreader 132. That is, in the cooling device 1-3, as a result, cooling air taken from the intake port 121 absorbs heat having been generated in the cooling target object 131 and having been conducted to the heat spreader 132, and part of the absorbed heat is conducted to the heat sink 11.

When the flow speed of the air flowing in the inside of the fluid path 12 is made sufficiently fast, the heat from the cooling target object 131 is not conducted to the heat sink 11 so much, and warmed air inside the fluid path 12 is discharged from the discharge port 122 as it is. In such a case, since the thermal conductivity of the heat sink 11 may be made small, a material selection range for the heat sink 11 is widened. In such a case, the amount of heat transferred from the heat sink 11 to the inside of the information processing apparatus 10 is reduced, and thus, the capacity of the fan 136, installed in the information processing apparatus 10, may be made small. In this regard, however, since all mount of the heat from the cooling target object 131 is not absorbed by only the air flowing in the inside of the fluid path 12, the heat sink 11 is preferable to be thermally coupled to the cooling target object 131 via the fluid path 12.

In modification example 1, a configuration in which the whole of the heat exchange portion is exposed to the outside of the heat sink 11 has been described, but this configuration may be modified so as to allow at least part of the heat exchange portion to be exposed to the outside of the heat sink 11. In other words, the configuration is sufficient, provided that part of the first path and the second path is disposed at the outside of the heat sink 11. For example, a structure that allows the first path 124 to penetrate the inside of the heat sink 11 and allows the second path 126 to be returned from the upper side of the outside of the heat sink 11 may be employed. Further, for example, a structure that allows the first path 124 to be disposed at the lower side of the outside of the heat sink 11 and allows the second path 126 to penetrate the inside of the heat sink may be employed.

Figure 8:
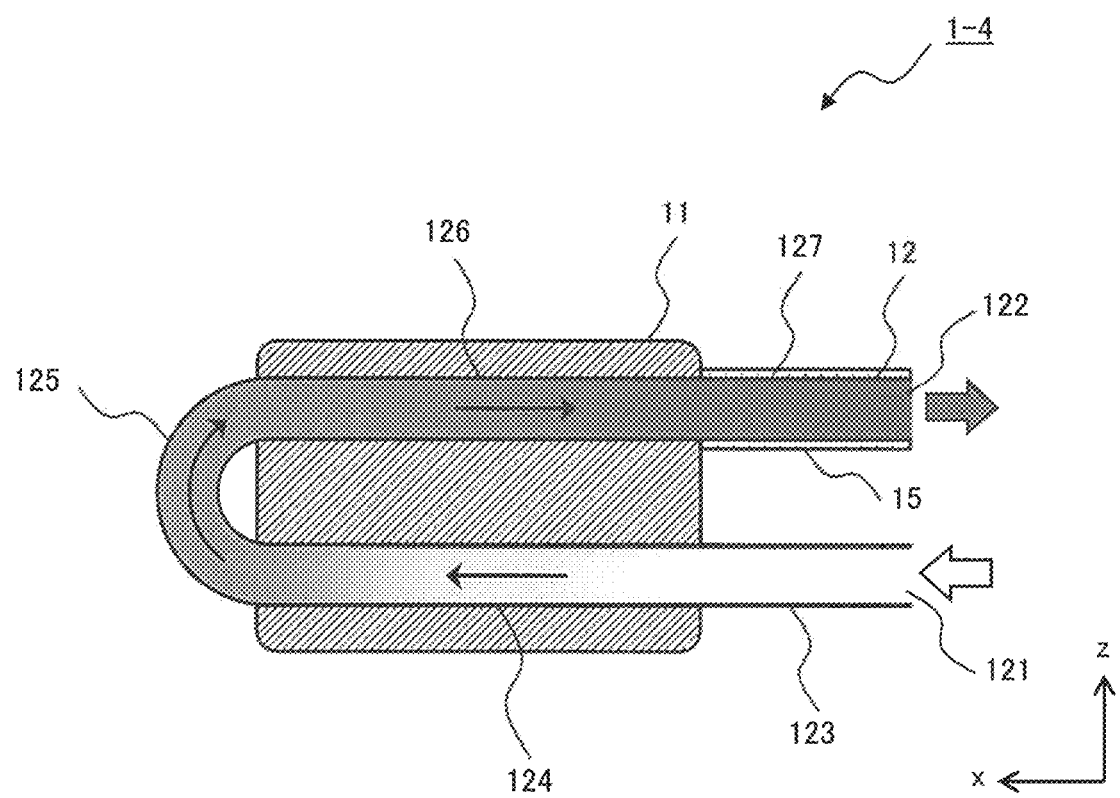
FIG. 8 is a conceptual diagram illustrating modification example 2 of a cooling device according to a first example embodiment of the present invention.

FIG. 8 is a cross-sectional view of a cooling device 1-4 in modification example 2. In the cooling device 1-4, a heat insulating material 15 is allowed to clad the periphery of at least one portion constituting the fluid path 12 and located at the outside of the heat sink 11. The heat insulating material 15 may be formed of a foamed material, such as urethane foam, phenol foam, polystyrene foam, or foamed rubber. Further, the heat insulating material 15 may be formed of a material based on fiber, such as glass fiber or cellulose fiber. The selection of a material for the heat insulating material 15 is not particularly limited, provided that the selected material has a heat insulation effect.

The heat insulating material 15 may clad only at least one portion of the fluid path 12. Although, in the example shown in FIG. 8, the periphery of the air discharge path 127 is clad by the heat insulating material 15, the periphery of the air supply path 123 may be clad by the heat insulating material 15. Further, each of the peripheries of both of the air supply path 123 and the air discharge path 127 may be clad by the heat insulating material 15. Further, each of the peripheries of the first path 124, the return path 125, and the second path 126, which constitute the heat exchange portion, may be clad by the heat insulating material 15.

According to the structure of modification example 2, the amount of air having been warmed by the heat sink 11 and having been transferred from the air discharge path 127 to other devices inside the information processing apparatus 10 is reduced, and thus, this configuration further increases the cooling effect. Further, the clad of the air supply path 123 by the heat insulating material 15 blocs cooling air introduced into the heat sink 11 from being warmed by heat inside the information processing apparatus 10.

Second Example Embodiment

Next, a cooling system 2, a cooling system according to a second example embodiment of the present invention, will be described with reference to some of the drawings. The cooling system 2, according to this example embodiment, includes a fluid sending mechanism, such as a supply fan or an exhaust fan, for sending air into a fluid path 12.

Figure 9:
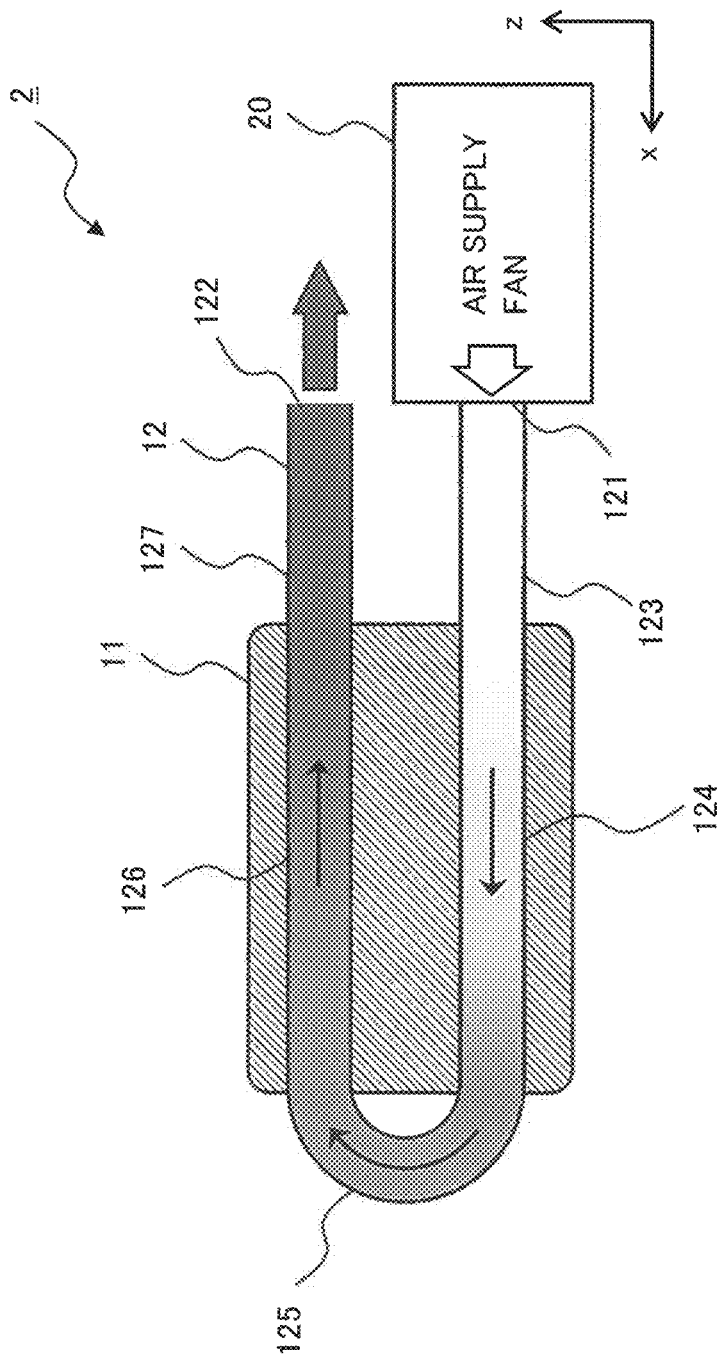
FIG. 9 is a conceptual diagram illustrating an exemplary configuration of a cooling system according to a second example embodiment of the present invention.

FIG. 9 is a conceptual diagram illustrating the configuration of the cooling system 2, according to this example embodiment. As shown in FIG. 9, the cooling system 2, according to this example embodiment, has a structure in which a supply fan 20 is secured to an intake port 121 of the fluid path 12.

The supply fan 20 is a device for sending air to the inside of the fluid path 12. For example, the supply fan 20 is realized by a fluid sending device, such as a fan, or a compression device, such as a compressor. A cooling device for cooling air and/or a filter for purifying air may be additionally disposed so as to be operated jointly with the supply fan 20.

The supply fan 20 sends air toward the inside of the fluid path 12 through the intake port 121. The air having been sent from the supply fan 20 is conducted to a first path 124 via an air supply path 123 and is warmed inside the first path 124. The warmed air passes through a return path 125, a second path 126, and an air discharge path 127, and then is discharged from a discharge port 122. The supply fan 20 is a device for controlling the flow of air inside the fluid path 12.

According to the cooling system according to this example embodiment, the speed and the temperature of air flowing in the inside of the fluid path 12 is adjusted by controlling the amount and the temperature of air sent from the supply fan 20. Thus, air having been adjusted into an appropriate state in response to a degree of heat generation of a cooling target object is sent into a heat discharge path.

Here, the disposition of the intake port 121 and the discharge port 122, which are included in the fluid path 12, and the supply fan 20 will be described with reference to FIGS. 10 to 12. That is, in examples shown in FIGS. 10 to 12, any one of the intake port 121 and the discharge port 122 is disposed at minimum in the inside of a building in which an information processing apparatus 10 is installed.

Figure 10:
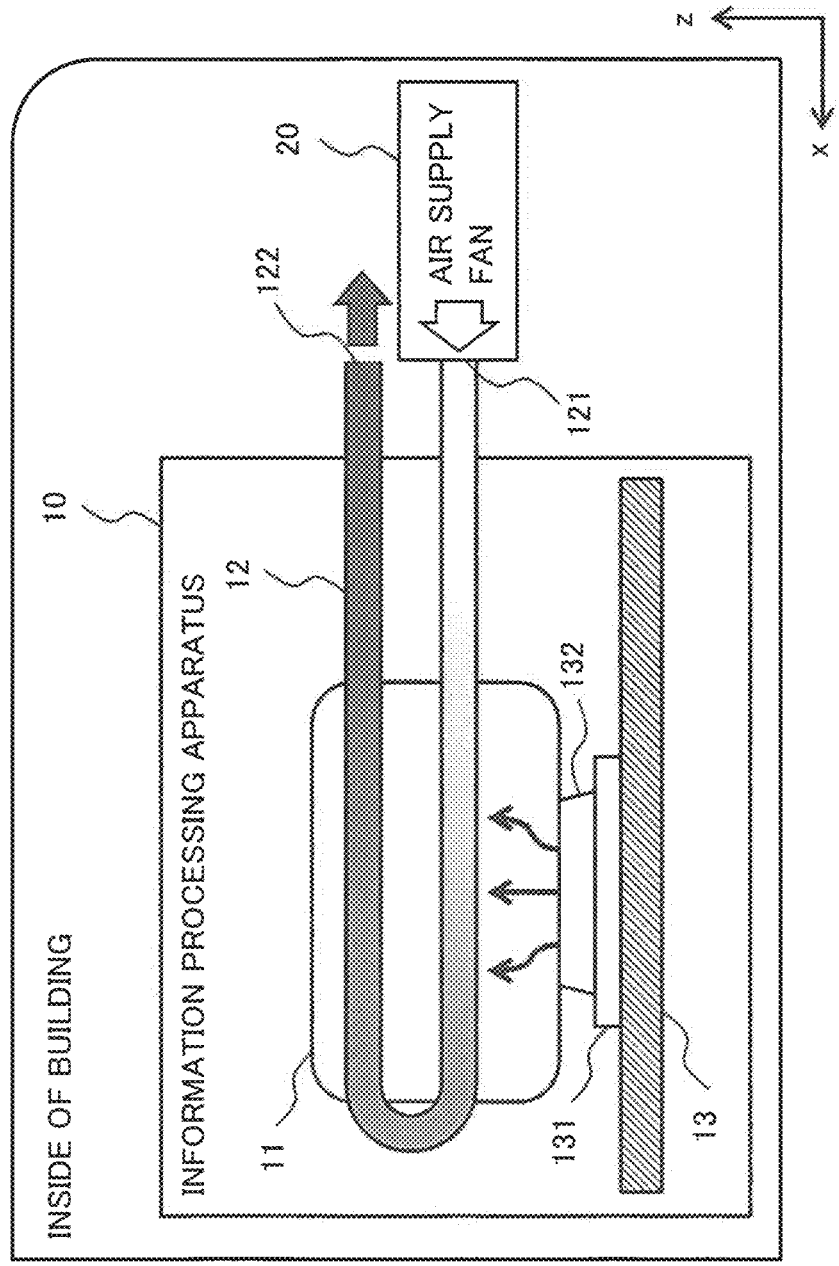
FIG. 10 is a conceptual diagram illustrating an example of the disposition of a cooling system according to a second example embodiment of the present invention.

FIG. 10 illustrates an example in which the supply fan 20 is disposed in the inside of the building, in which the information processing apparatus 10 is installed, and the discharge port 122 of the fluid path 12 is also disposed in the inside of the building. In the example shown in FIG. 10, heat discharged from the information processing apparatus 10 is emitted to the inside of the building, and thus, when the amount of the heat discharged from the information processing apparatus 10 is large, there is a need for installing a cooling mechanism in the inside of the building.

Figure 11:
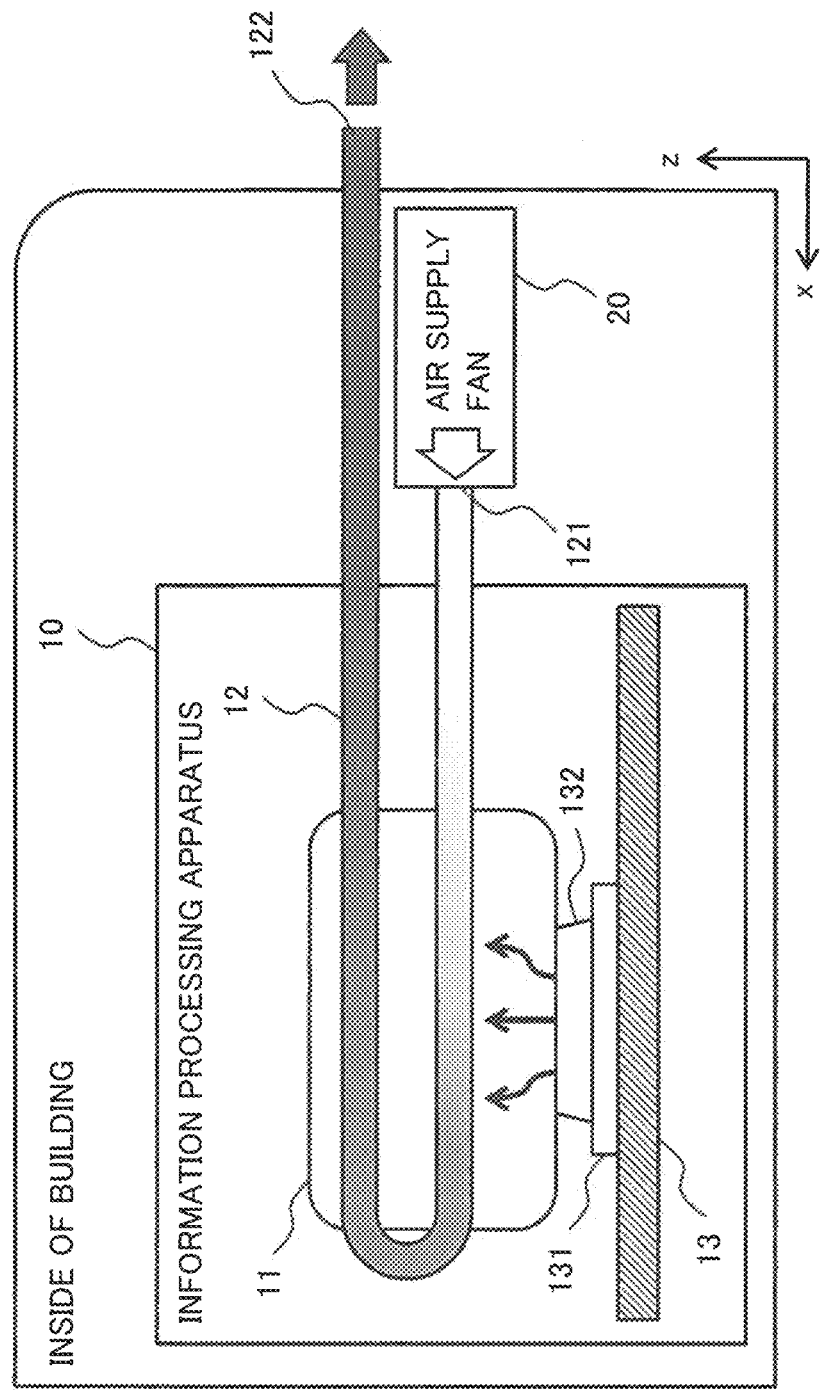
FIG. 11 is a conceptual diagram illustrating another example of the disposition of a cooling device according to a second example embodiment of the present invention.

FIG. 11 illustrates an example in which the supply fan 20 is disposed in the inside of the building, in which the information processing apparatus 10 is installed, and the discharge port 122 of the fluid path 12 is disposed at the outside of the building. In the example shown in FIG. 11, the heat discharged from the information processing apparatus 10 is emitted to the outside of the building, and thus, the cooling capacity of a cooling device installed in the inside of the building may be reduced.

Figure 12:
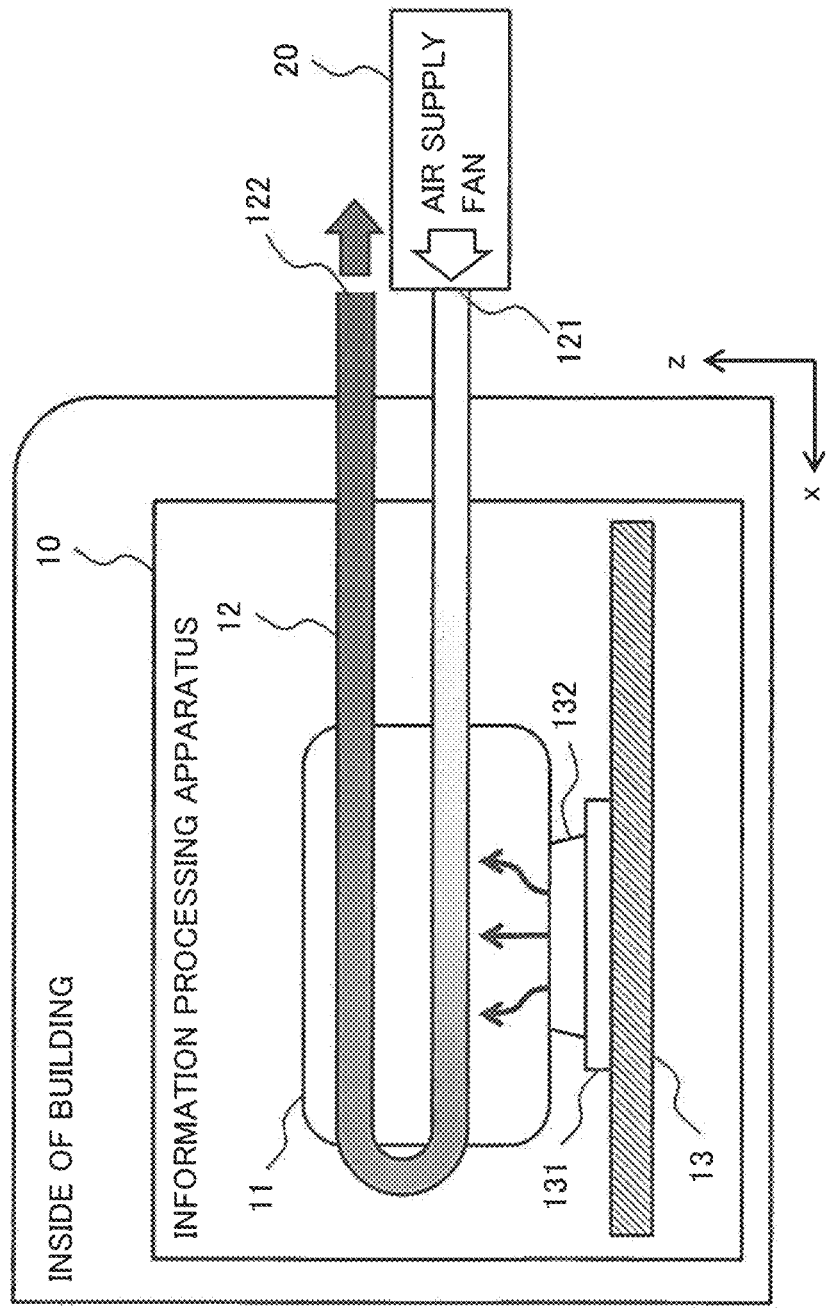
FIG. 12 is a conceptual diagram illustrating further another example of the disposition of a cooling system according to a second example embodiment of the present invention.

FIG. 12 illustrates an example in which both of the fluid path 12 and the supply fan 20 are disposed in the outside of the building. In the example shown in FIG. 12, the heat discharged from the information processing apparatus 10 is emitted to the outside of the building, and thus, the cooling capacity of a cooling mechanism for the inside of the building may be reduced. Further, in the example shown in FIG. 12, the supply fan 20 can be installed at the outside of the building, and thus, this configuration is preferable when there is a spatial restriction on the device installation in the inside of the building.

In the cooling system according to this example embodiment, there are a plurality of variations in the installation places of the intake port and the discharge port. When an indoor exhaust system is employed, the environmental temperature of the inside of the building rises due to the influence of the heat discharged from the information processing apparatus, and thus, in order to keep the environmental temperature of the inside to a constant temperature, the cooling capacity is required to be increased so as to cool the inside. In contrast, when an outdoor exhaust system is employed, there is no need for taking into consideration the influence of the heat discharged from the information processing, and thus, the internal cooling capacity in the case of the outdoor exhaust system may be reduced to a greater degree, as compared with the internal cooling capacity in the case of the indoor circulation system.

Modification Example

Here, a modification example of the cooling system 2, according to this example embodiment, will be described with reference to some of the drawings.

Figure 13:
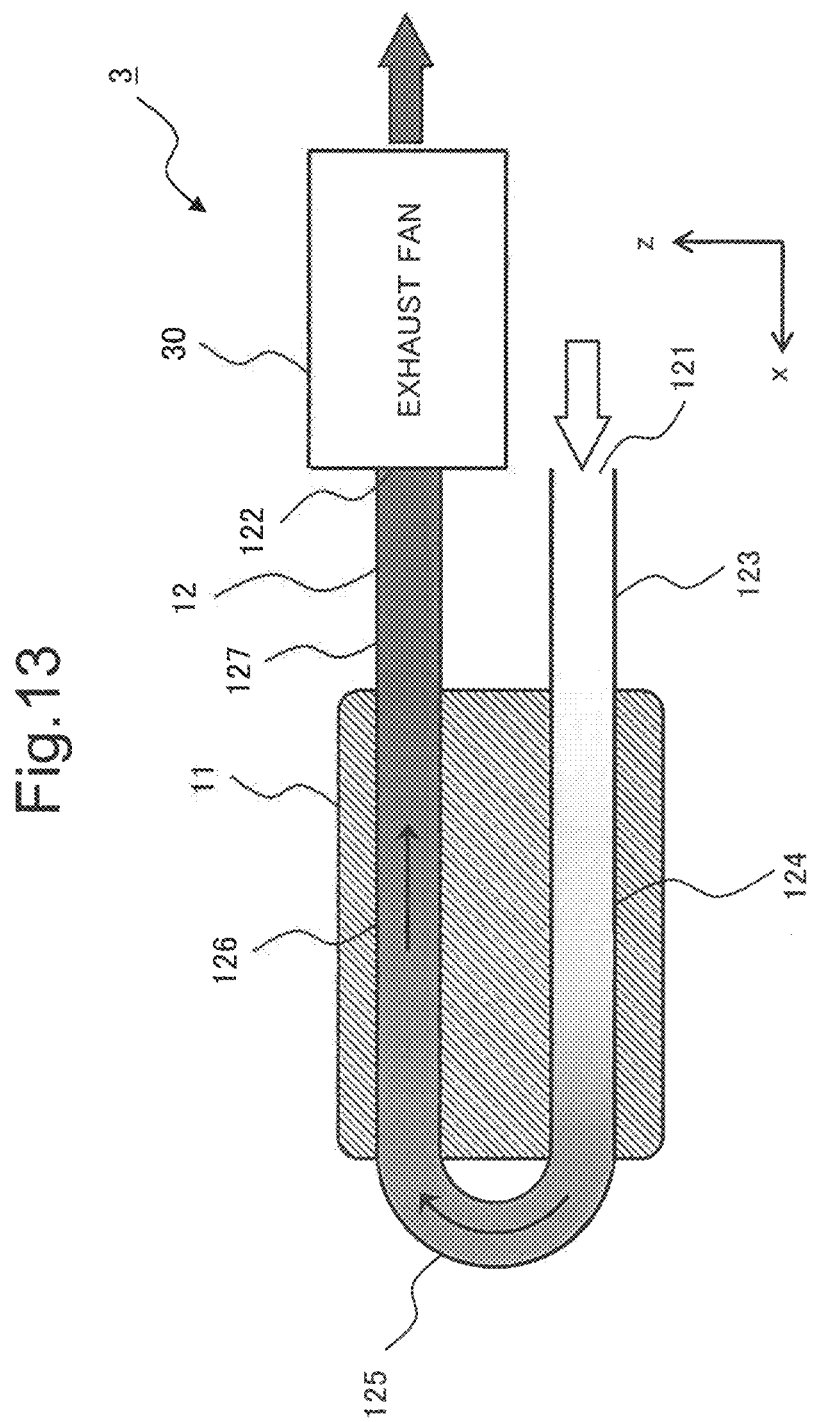
FIG. 13 is a conceptual diagram illustrating a modification example of a cooling system according to a second example embodiment of the present invention.

FIG. 13 is conceptual diagram illustrating the configuration of a cooling system 3 in this modification example. As shown in FIG. 13, the cooling system 3, in this modification example, has a structure in which an exhaust fan 30 is attached to the discharge port 122 of the fluid path 12.

The exhaust fan 30 is a device for discharging air from the inside of the fluid path 12. For example, the exhaust fan 30 is realized by a vacuum pump. A cooling device for cooling air may be additionally disposed at the side of the intake port 121. Further, a filter for purifying air taken into the intake port 121, a cooling device for cooling air having been warmed by the heat sink 11, and/or any other device may be additionally disposed.

According to the cooling system 3 in this modification example, the same effects as those of the cooling system 2 are obtained.

Third Example Embodiment

Figure 14:
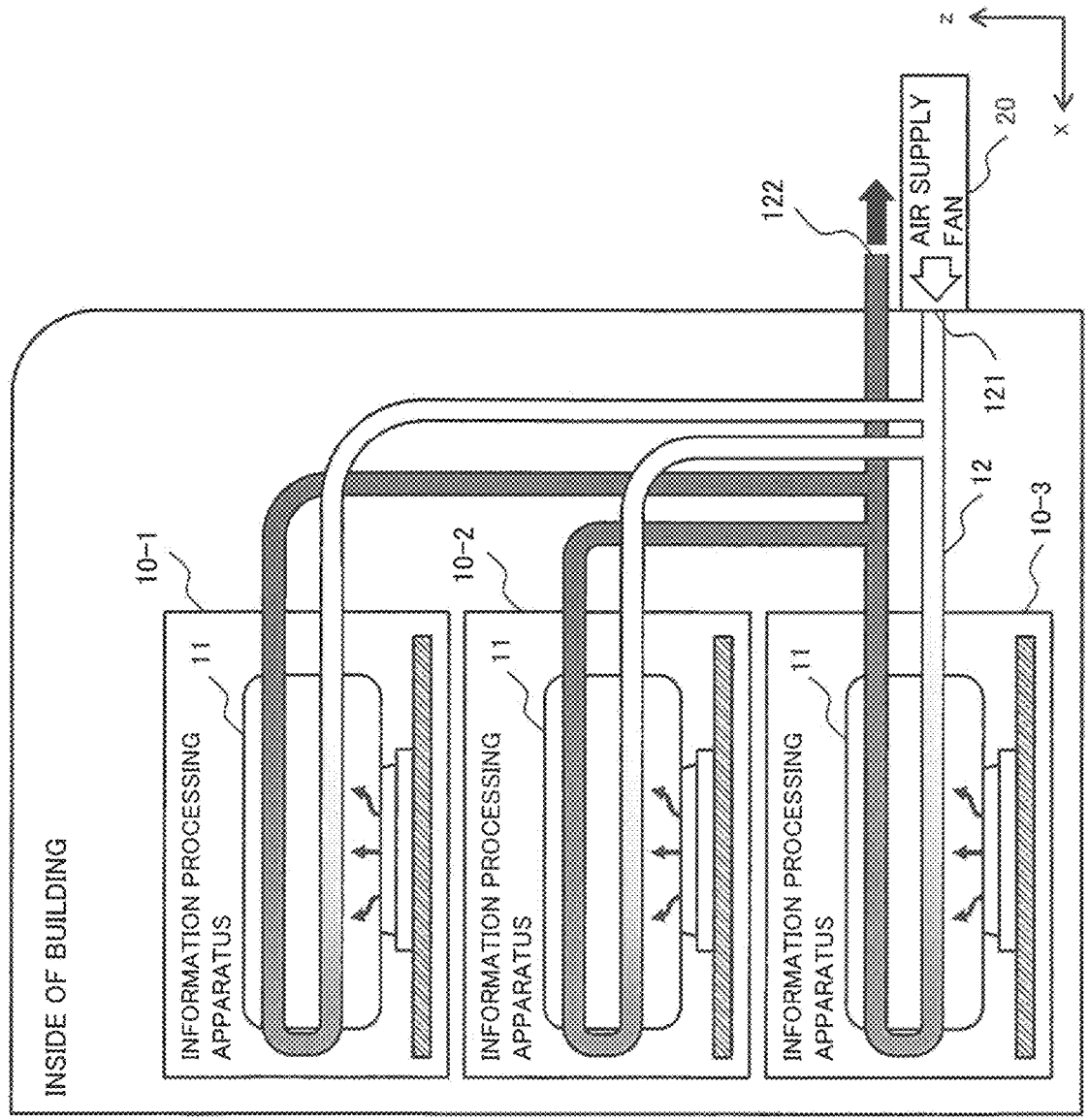
FIG. 14 is a conceptual diagram illustrating an example of the disposition of a cooling system according to a third example embodiment of the present invention.
Figure 15:
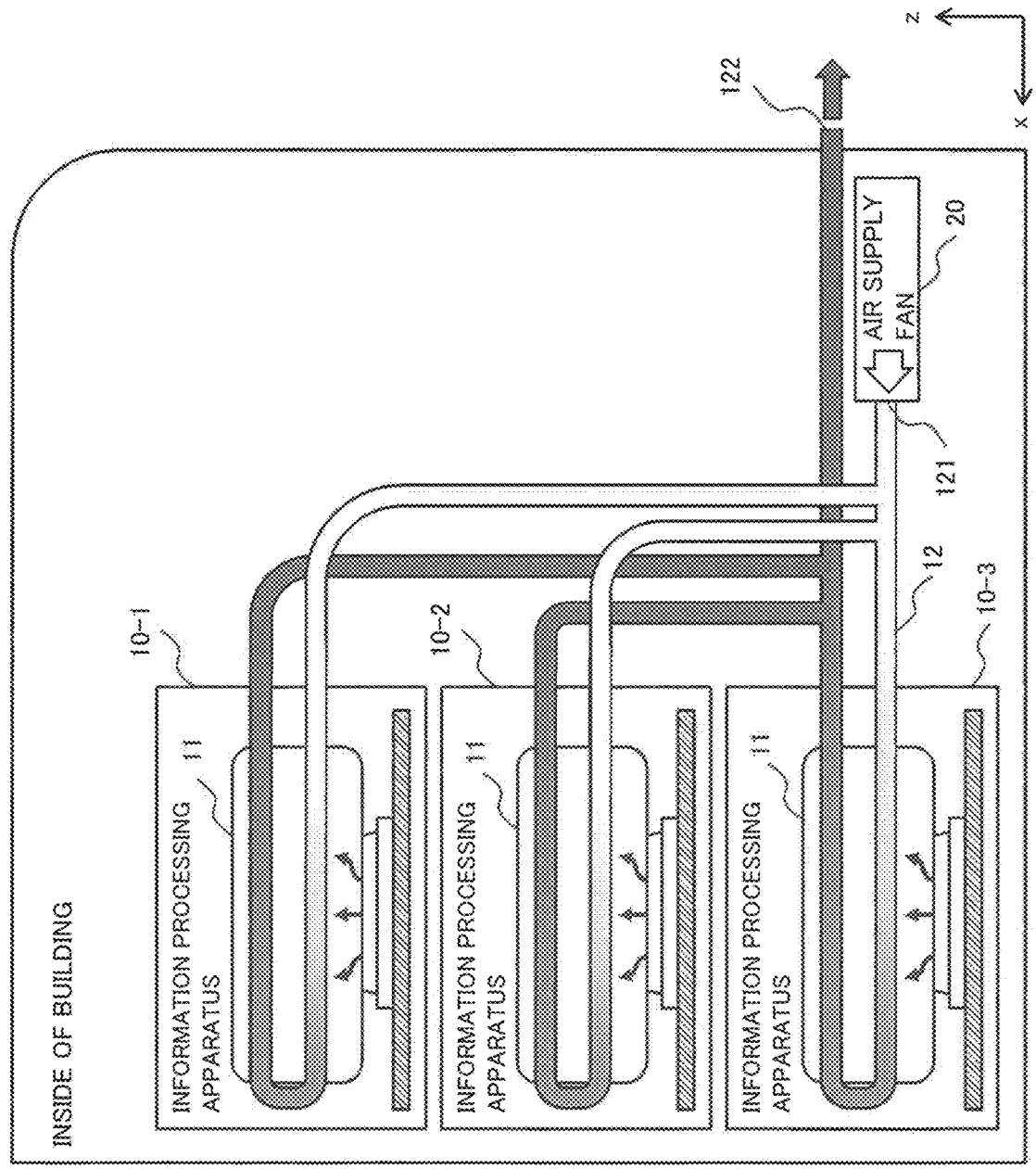
FIG. 15 is a conceptual diagram illustrating another example of the disposition of a cooling system according to a third example embodiment of the present invention.
Figure 16:
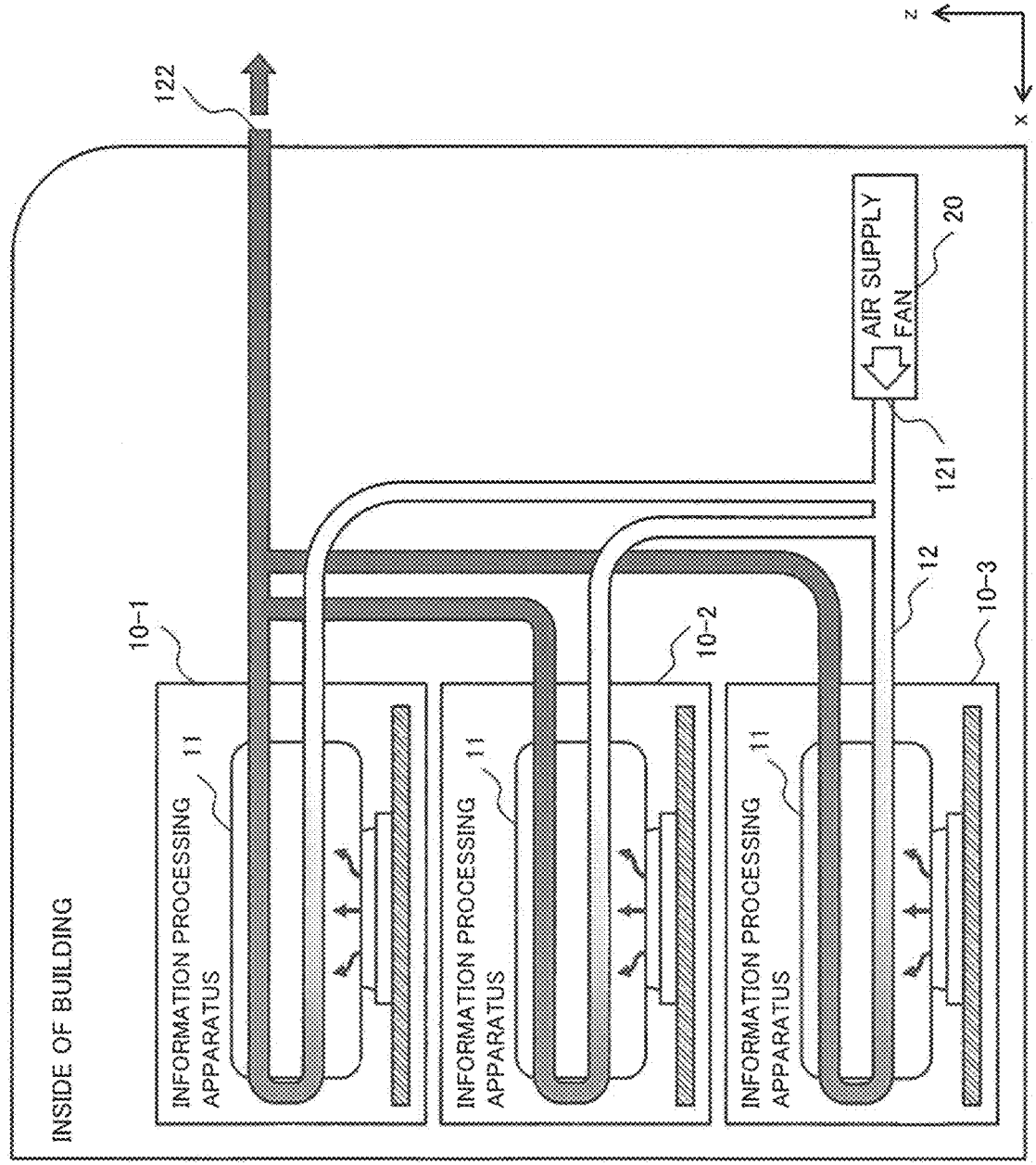
FIG. 16 is a conceptual diagram illustrating further another example of the disposition of a cooling system according to a third example embodiment of the present invention.

FIGS. 14 to 16 are conceptual diagrams illustrating exemplary configurations of cooling systems according to a third example embodiment of the present invention. FIGS. 14 to 16 illustrate examples in each of which a plurality of information processing apparatus 10-1 to 10-3 (hereinafter referred to as just information processing apparatuses 10) are disposed in the inside of a building. Although, in FIGS. 14 to 16, examples in each of which a cooling system according to this example embodiment is installed in three information processing apparatuses 10 are illustrated, the cooling system according to this example embodiment may be installed in any plural numbers of information processing apparatuses 10.

In this example embodiment, a fluid path 12 includes a plurality of heat exchange portions each including a pair of first and second paths. Each of the plurality of heat exchange portions is thermally coupled to a corresponding one of a plurality of heat sinks 11, and each of the plurality of heat sinks 11 is thermally coupled to a corresponding one of mutually different cooling target objects.

FIG. 14 illustrates an example in which a discharge port 122, which is a discharge port for the fluid path 12, and an air supply fan 20 are disposed in the outside of a building. The fluid path 12 shown in FIG. 14 is branched into a plurality of branched fluid paths 12 each inserted into a corresponding one of the plurality of information processing apparatuses 10, and then, the each branched fluid path 12 is thermally coupled to a heat sink 11 mounted on a cooling target object of the corresponding one of the information processing apparatuses 10. Further, the each branched fluid path 12, having been branched and inserted into the corresponding one of the information processing apparatuses 10, is disposed so as to inject air from the outside of the building, and carry air having been warmed by heat of the heat sink 11 to the outside of the corresponding one of the information processing apparatuses 10. The each branched fluid path 12, which carries heat discharged from the corresponding one of the information processing apparatuses 10 and is returned, is united into one fluid path, and this united fluid path is extended to the outside of the building.

That is, according to the configuration shown in FIG. 14, the cooling system has a structure that allows the fluid path 12 to be secured to the outside of the building.

FIG. 15 illustrates an example in which the discharge port 122 of the fluid path 12 is disposed at the outside of the building, and the air supply fan 20 is disposed in the inside of the building. The configuration of the fluid path 12 shown in FIG. 15 is similar to that of the fluid path 12 shown in FIG. 14. The configuration in the example shown in FIG. 15 is preferable, for example, in a case where there is a space at which the air supply fan 20 is installed in the inside of the building, and a cooling device is additionally disposed so as to be operated jointly with the air supply fan 20.

FIG. 16 illustrates an example in which the discharge port 122 of the fluid path 12 is disposed at the outside of the building, and the air supply fan 20 is disposed in the inside of the building. The configuration in the example shown in FIG. 16 is different from the configuration in the example shown in FIG. 15 in that the discharge port 122 shown in FIG. 16 is installed at the upper side of the building. Warmed air is likely to move to the upper side, and thus, the configuration in the example shown in FIG. 16 increases the heat discharge effect. That is, in the example shown in FIG. 16, both end portions of the fluid path 12 are disposed at positions insulated from each other.

As described above, in the cooling system according to this example embodiment, there are also a plurality of variations in the installation places for the intake port and the discharge port just like the example in the second example embodiment. In FIGS. 14 to 16, examples in each of which each of the plurality of heat exchange portions is thermally coupled to a corresponding one of a plurality of the heat sinks 11 each of which is thermally coupled to a cooling target object mounted in a corresponding one of the mutually different apparatuses, are illustrated. This configuration may be modified such that each of the plurality of heat exchange portions is thermally coupled to a plurality of heat sinks 11 each thermally coupled to a corresponding one of mutually different cooling target objects mounted in the same information processing apparatus 10.

In this example embodiment, paths into each of which heat discharged from a corresponding one of a plurality of information apparatuses is conducted are unified into one path in the inside of the building, and then, the heat is discharged from this unified path to the outside of the building, and thus, this configuration realizes the reduction of the cooling capacity in the inside of the building. The temperature of the inside of the building is required to be adjusted to a suitable temperature falling within a predetermined temperature range because each of the information processing apparatuses has its own operable temperature range. Further, in the inside of a building, such as a data center, in which a large number of information processing apparatuses are installed, cooling is required in order to cause heat generated from each of the information processing apparatuses not to be confined in the inside of the building. In general configurations, therefore, in order to increase the cooling capacity in the inside of a building, there has been a need for causing a large-scale cooling device to operate to cool the building itself, but according to this example embodiment, this need is eliminated.

The cooling device according to each of the aforementioned example embodiments of the present invention can be used for cooling any one or more of devices that generate heat, such as a central processing unit (CPU) and a graphics processing unit (GPU), mounted in an information processing apparatus, such as a computer or a server. The cooling device according to each of the aforementioned example embodiments of the present invention can be used for cooling any power semiconductor component for electric power equipment, and any device mounted in a light source of a projector, or any other high power-consumption type equipment.

The previous description of embodiments is provided to enable a person skilled in the art to make and use the present invention. Moreover, various modifications to these example embodiments will be readily apparent to those skilled in the art, and the generic principles and specific examples defined herein may be applied to other embodiments without the use of inventive faculty. Therefore, the present invention is not intended to be limited to the example embodiments described herein but is to be accorded the widest scope as defined by the limitations of the claims and equivalents.

Further, it is noted that the inventor's intent is to retain all equivalents of the claimed invention even if the claims are amended during prosecution.

What is claimed is:

1. A cooling device comprising:
    a heat sink configured to be a block having a heat receiving face whose outer surface is configured to be placed in contact with an outer surface of a cooling target CPU (Central Processing Unit) via a heat spreader; and
    a fluid path including a heat exchange portion, the fluid path being formed so as to allow a predetermined fluid to pass through the fluid path, the heat exchange portion including a first path configured to be inserted into the inside of the heat sink and thermally coupled to the heat sink, the first path configured to be arranged in parallel to the heat receiving face of the heat sink, wherein
    the heat exchange portion includes a second path configured to be inserted into the inside of the heat sink and thermally coupled to the heat sink, the second path configured to be disposed at a position located farther from the heat receiving face than the first path, and the second path configured to be arranged side by side with the first path and receiving the predetermined fluid having passed through the first path, and
    the first path and the second pathing having a tubular pipe-shaped structure, arranged linearly inside the heat sink and arranged parallel to each other inside the heat sink.

2. The cooling device according to claim 1, wherein the fluid path includes an intake port extending from the first path and a discharge port extending from the second path.

3. The cooling device according to claim 2, wherein the intake port and the discharge port are disposed outside of an apparatus in which the cooling target device is mounted.

4. The cooling device according to claim 1, wherein each of the first path and the second path is branched into a plurality of branched paths.

5. The cooling device according to claim 1, wherein the heat exchange portion includes a structure in which a plurality of pairs of the first path and the second path are coupled to one another, and
    two successive pairs among the plurality of pairs of the first path and the second path are coupled to each other so as to allow the predetermined fluid having passed through the second path included in an upstream-side pair of any of the two successive pairs of the plurality of pairs of the first path and the second path to be conveyed into the first path included in a downstream-side pair of the any of the two successive pairs of the plurality of pairs of the first path and the second path.

6. The cooling device according to claim 1, wherein portions of the first path and the second path are disposed outside of the heat sink.

7. The cooling device according to claim 1, further comprising a pump that sends the predetermined fluid into the fluid path.

8. The cooling device according to claim 1, wherein a portion of the fluid path is covered with a heat insulating material.

9. The cooling device according to claim 1, wherein the fluid path includes a plurality of second heat exchange portions, and each of the plurality of second heat exchange portions is thermally coupled to one or more of a plurality of second heat sinks thermally coupled to different cooling target devices.

10. A cooling device comprising:
    a heat sink configured to be a block having a heat receiving face whose outer surface is configured to be placed in contact with an outer surface of a cooling target CPU (Central Processing Unit) via a heat spreader; and
    a fluid path including a heat exchange portion, the fluid path being formed so as to allow a predetermined fluid to pass through the fluid path, the heat exchange portion including a plurality of first paths configured to be inserted into the inside of the heat sink and thermally coupled to the heat sink, and the plurality of first paths arranged in parallel to the heat receiving face of the heat sink,
    wherein the heat exchange portion includes a plurality of second paths configured to be inserted into the inside of the heat sink and thermally coupled to the heat sink, the plurality of second paths disposed at a position located farther from the heat receiving face than the plurality of first paths, and each of the plurality of second paths configured to be connected to one of the plurality of first paths by a turning path and receiving the predetermined fluid having passed through one of the plurality of first paths, and
    the plurality of first paths and the plurality of second paths having a pipe-shaped structure, arranged linearly inside the heat sink, and arranged parallel to each other inside the heat sink.

* * * * *